United States Patent [19]
Norman et al.

[11] Patent Number: 5,681,756
[45] Date of Patent: Oct. 28, 1997

[54] METHOD OF FABRICATING AN INTEGRATED MULTICOLOR ORGANIC LED ARRAY

[75] Inventors: Michael P. Norman, Chandler; Thomas B. Harvey, III, Scottsdale; Xiaodong T. Zhu, Chandler, all of Ariz.

[73] Assignee: Motorola, Schaumburg, Ill.

[21] Appl. No.: 452,777

[22] Filed: May 30, 1995

Related U.S. Application Data

[62] Division of Ser. No. 251,440, May 31, 1994, Pat. No. 5,424,560.

[51] Int. Cl.⁶ .................................................. H01L 21/76
[52] U.S. Cl. ........................ 437/1; 437/127; 437/905; 437/181; 148/DIG. 99
[58] Field of Search ............................... 437/23, 905, 1, 437/181; 148/DIG. 99; 257/89, 90, 91

[56] References Cited

FOREIGN PATENT DOCUMENTS

| | | |
|---|---|---|
| 59-229863 | 12/1984 | Japan. |
| 60-202971 | 10/1985 | Japan. |
| 2-283079 | 11/1990 | Japan. |
| 5-347432 | 12/1993 | Japan. |
| 6-163998 | 6/1994 | Japan. |

Primary Examiner—George Fourson
Attorney, Agent, or Firm—Eugene A. Parsons

[57] ABSTRACT

A method of fabricating an integrated multicolor organic LED array including providing a negative layer and patterning a plurality of different color LED organic layers, one at a time, on the negative layer to form a plurality of different color LEDs in a plurality of areas of a selected array. A first color LED organic layer is patterned on the negative layer in first areas and to define additional areas for additional LEDs laterally separated from the first color LEDs and a final color LED organic layer is deposited in final areas and on previously patterned layers to form a plurality of final color LEDs. Transparent positive contacts are then formed on the final color LED layer in the first and final areas so as to form positive contacts to the first and the final color LEDs.

2 Claims, 5 Drawing Sheets

METHOD OF FABRICATING AN INTEGRATED MULTICOLOR ORGANIC LED ARRAY

This is a division of application Ser. No. 08/251,440, filed May 31, 1994, now U.S. Pat. No. 5,424,560.

FIELD OF THE INVENTION

The present invention pertains to multicolor organic LED arrays and more specifically to a new method of fabricating multicolor organic LED arrays.

BACKGROUND OF THE INVENTION

Organic light emitting diodes (LEDs) are becoming very popular because of the simplicity of fabricating the LEDs and the relatively low cost of materials. While multi-color organics, i.e., organics that emit different colors when properly activated, are known, generally all prior art disclosures of organic LEDs discuss a single color LED. To form multi-color displays and the like using the teachings of the prior art requires extensive fabrication techniques with each LED, or each color of LED, being formed separately on a substrate.

Accordingly, it would be highly advantageous to develop a method of fabrication, and fabricated color LED array, which is simple and inexpensive.

It is a purpose of the present invention to provide a new and improved method of fabricating an integrated multicolor organic LED array and the integrated multicolor organic LED array fabricated.

It is a further purpose of the present invention to provide a new and improved method of fabricating an integrated multicolor organic LED array which is relatively simple and inexpensive.

It is a still further purpose of the present invention to provide a new and improved method of fabricating an integrated multicolor organic LED array which is easily integrated into drive circuits using well known technology.

It is another purpose of the present invention to provide a new and improved method of fabricating an integrated multicolor organic LED array which requires fewer steps and, therefore, is less labor intensive.

SUMMARY OF THE INVENTION

The above problems and others are at least partially solved and the above purposes and others are realized in a method of fabricating an integrated multicolor organic LED array including the steps of providing a negative electrical layer having a surface and patterning a plurality of different color LED organic layers, one at a time, on the surface of the negative electrical layer to form a plurality of different color LEDs in a plurality of areas of a selected array, a first color LED organic layer of the plurality of organic layers being patterned on the surface of the negative electrical layer in first areas and to define additional areas in the selected array for additional LEDs laterally separated from the first color LEDs in the first areas and a final color LED organic layer of the plurality of organic layers being deposited on the surface in defined final areas of the additional areas and on previously patterned color organic layers to form a plurality of final color LEDs in the defined final areas of the selected array. First transparent positive electrical contacts are then formed on the final color LED layer in the first areas so as to form positive electrical contacts to the plurality of first color LEDs and final transparent positive electrical contacts are formed on the final color LED layer in the final areas so as to form positive electrical contacts to the plurality of final color LEDs.

The above problems and others are at least partially solved and the above purposes and others are further realized in an integrated multicolor organic LED array including a negative electrical layer having a surface and a plurality of different color LED organic layers positioned on the surface of the negative electrical layer to form a plurality of different color LEDs in a plurality of areas of a selected array. A first color LED organic layer of the plurality of organic layers is patterned on the surface of the negative electrical layer in a first area and so as to define additional areas in the selected array for additional LEDs laterally separated from the first color LEDs in the first areas. A final color LED organic layer of the plurality of organic layers is deposited on the surface in defined final areas of the additional areas and on previously patterned color organic layers to form a plurality of final color LEDs in the defined final areas of the selected array. First transparent positive electrical contacts are positioned on the final color LED layer in the first areas so as to form positive electrical contacts to the plurality of first color LEDs and final transparent positive electrical contacts are positioned on the final color LED layer in the final areas so as to form positive electrical contacts to the plurality of final color LEDs.

BRIEF DESCRIPTION OF THE DRAWINGS

Referring to the drawings wherein like characters indicate like parts throughout the various figures.

DESCRIPTION OF THE PREFERRED EMBODIMENTS

Figure 1:
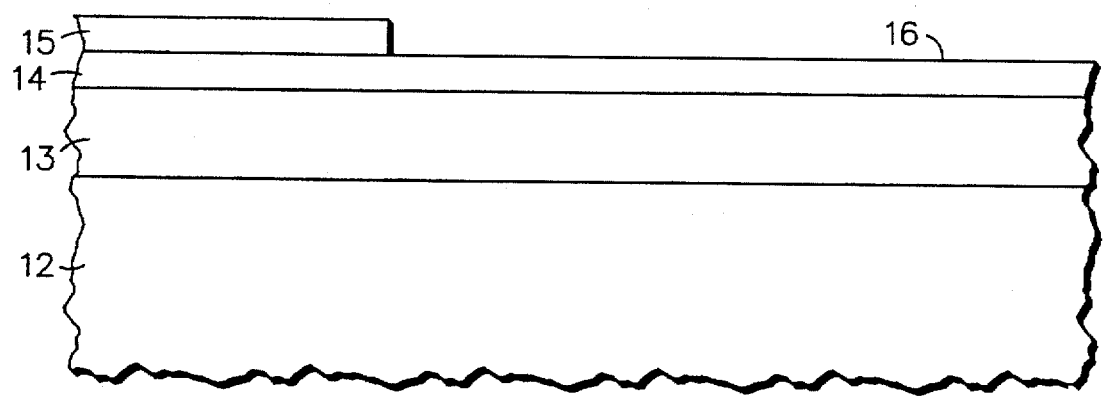
FIG. 1 is an enlarged, simplified sectional view of an intermediate structure in the fabrication of an integrated multicolor organic LED array in accordance with the present invention, portions thereof broken away.

Referring specifically to FIG. 1, an enlarged simplified sectional view is illustrated of an intermediate structure in the fabrication of an integrated multicolor organic LED array 10 in accordance with the present invention. The structure illustrated in FIG. 1 includes a supporting member or layer of material, which for convenience is referred to herein as a substrate 12. In a preferred embodiment, as will be explained more fully later, substrate 12 includes a semiconductor material such as silicon, or gallium arsenide.

A negative contact layer 13 is positioned on the surface of substrate 12 and includes either a layer of metal or heavily doped areas adjacent the surface of substrate 12. In this specific embodiment, an optional electron transport layer 14 is positioned on the surface of layer 13. Layers 12 and 13 are referred to herein jointly as a negative electrical layer or contact and serve as the negative terminal of diode array 10. It should be understood that electron transport layer 14 is generally very thin (in the range of approximately 200–700 angstroms) so that electrons are predominantly transported vertically (across layer 14) therethrough with little or no lateral or horizontal movement in layer 14. Thus, to form row connections negative contact layer 13 is formed into rows, as can be seen most clearly in FIG. 2, and electron transport layer 14 is formed in a blanket deposition to provide a generally planar upper surface 16 for convenient deposition of additional layers.

An organic layer or layers 15 includes one or more layers of polymers or low molecular weight organic compounds. Hereinafter, for simplification of this disclosure, the term organic/polymer will be shortened to "organic" but it should be understood that this term is intend to encompass all polymers or low molecular weight organic compounds. The organic materials that form layers 15 are chosen for their combination of electrical, luminescent and color properties, and various combinations of hole transporting, electron transporting, and luminescent materials can be used. In this embodiment, for example, layer 15 is a luminescent hole transport layer and layer 14 is an electron transport layer which cooperates with layer 15 to provide the desired light emission. Also, in this specific embodiment layer 15 is chosen from a material structure with an electroluminescent emission spectrum having a dominant wavelength in the red, so as to emit red light when properly energized and will be referred to hereinafter as a red organic layer.

Figure 2:
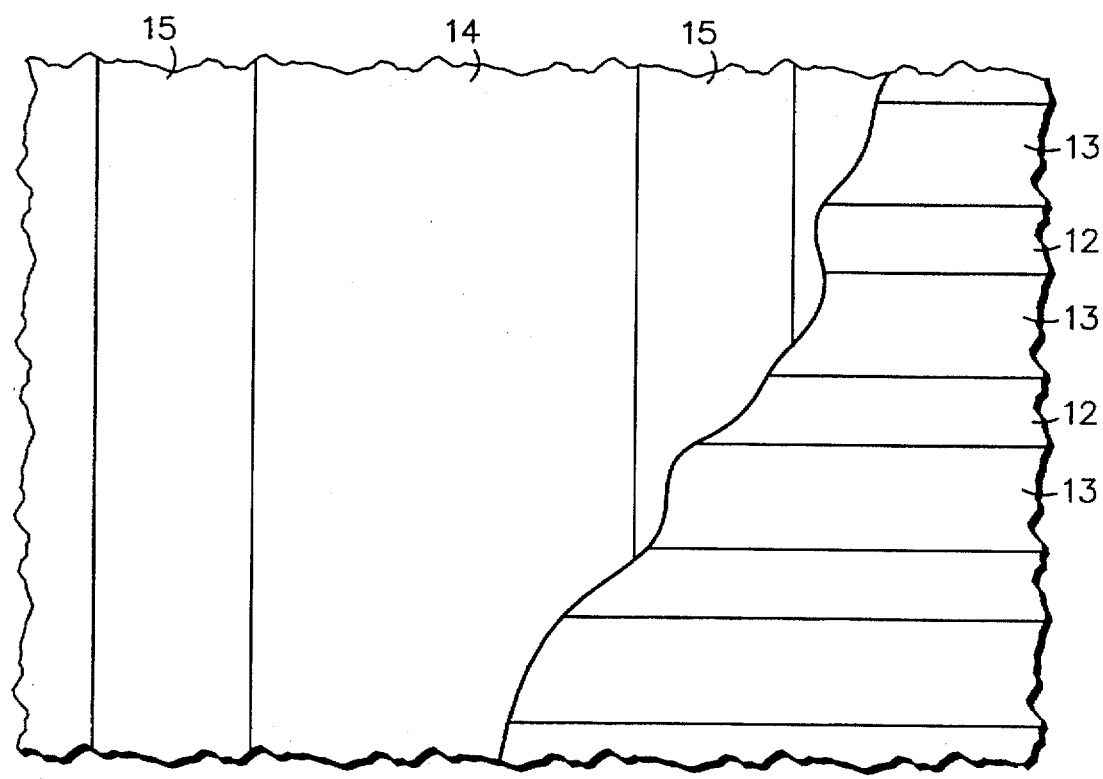
FIG. 2 is a view in top plan of the structure of FIG. 1.

Referring specifically to FIG. 2, it can be seen that, in this specific embodiment, organic layer or layers 15 are patterned in columns or strips which are spaced horizontally apart with areas of surface 16 of electron transport layer 14 exposed therebetween.

Figure 3:
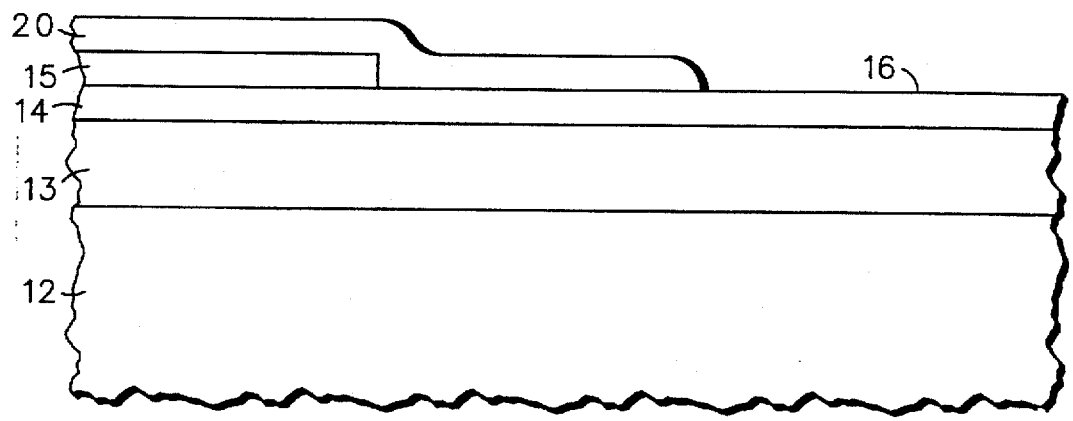
FIG. 3 is an enlarged, simplified sectional view similar to FIG. 1, illustrating a next step in the fabrication process.
Figure 4:
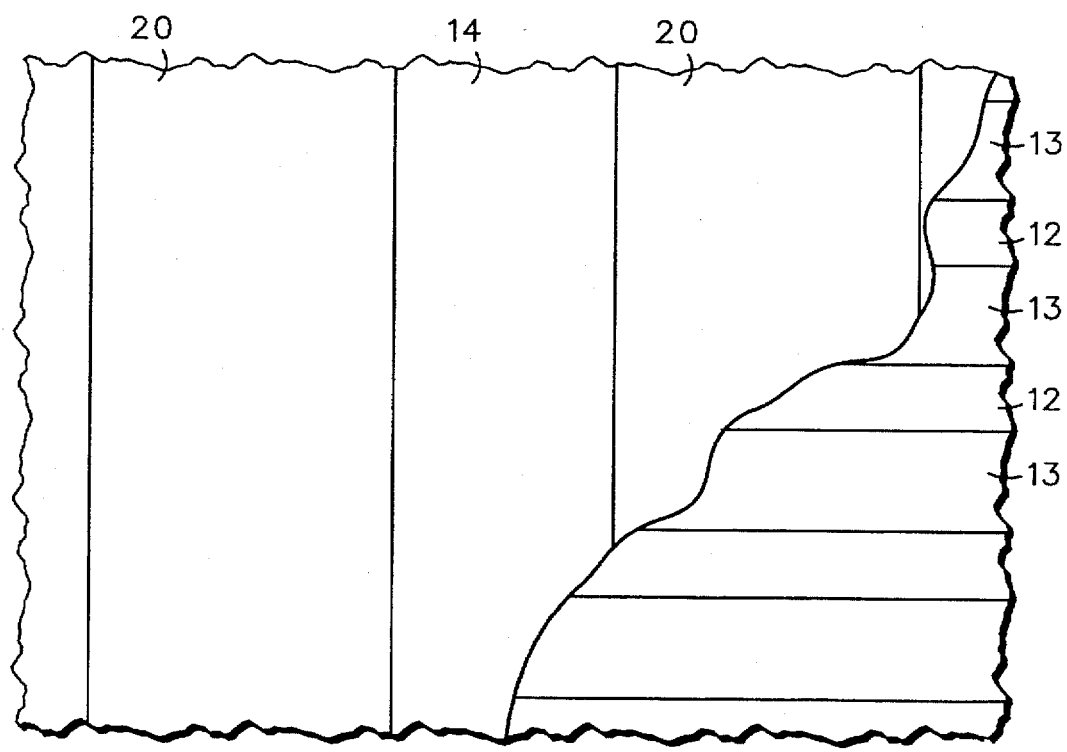
FIG. 4 is a view in top plan of the structure of FIG. 3.

Referring specifically to FIGS. 3 and 4, a second organic layer or layers 20 including one or more layers of polymers or low molecular weight organic compounds is patterned onto the exposed surface 16 of electron transport layer 14. Layer 20 is again patterned in columns or strips, as can be seen more clearly in FIG. 4, which are spaced horizontally apart with areas of surface 16 of electron transport layer 14 exposed therebetween. It should be noted that layer 20 is also formed over the surface of layer 15. Further, in this specific embodiment layer 15 is chosen so as to emit green light when properly energized and will be referred to hereafter as a green organic layer.

Figure 5:
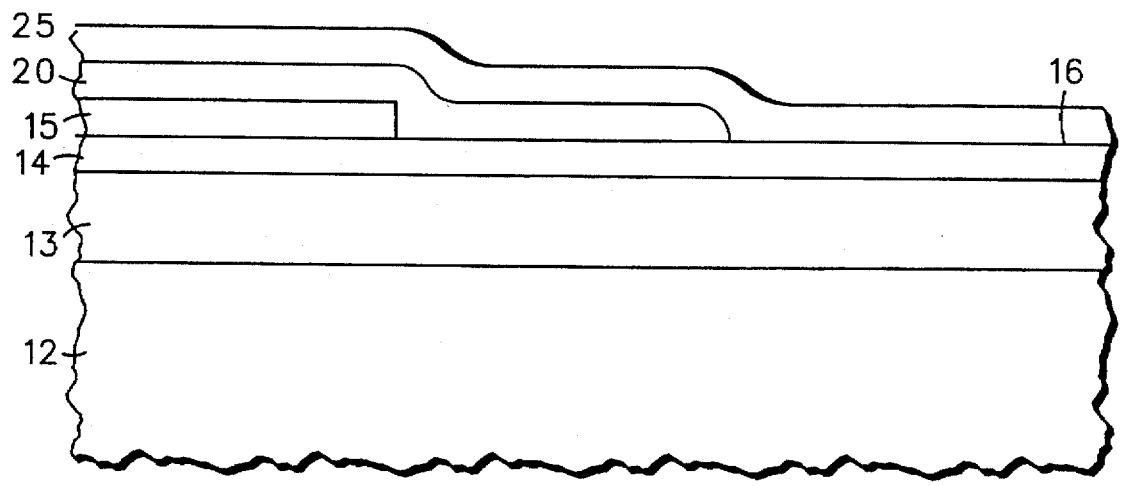
FIG. 5 is an enlarged, simplified sectional view similar to FIG. 3, illustrating a next step in the fabrication process.

Referring specifically to FIG. 5, a third, or final, organic layer or layers 25 including one or more layers of polymers or low molecular weight organic compounds is deposited onto the exposed surface 16 of electron transport layer 14 and on the surface of layer 20. Because layer 20 was patterned in columns or strips so as to leave strips of surface 16 of electron transport layer 14 exposed, layer 25 is also deposited on surface 16 of electron transport layer 14 in strips. Also, in this specific embodiment layer 25 is chosen so as to emit blue light when properly energized and will be referred to hereafter as a blue organic layer.

In general, in organic electroluminescent or LED devices it should be understood that organic layers 15, 20 and 25 do not conduct electrons well and the electron resistivities (e.g., approximately $10e^{-7}$) are much higher than the hole resistivities (e.g., approximately $10e^{-3}$) in the same material. Also, electron transport layer 14 conducts electrons relatively well but does not conduct holes well and can thus be thought of as a hole blocking layer. Further, it should be understood that generally light, or photons, is generated when electrons and holes combine. Thus, because holes are transported readily through organic layers 15, 20 and 25 and because electrons are transported readily through electron transport layer 14, substantially all recombination of holes and electrons occurs at or near surface 16 of layer 14. Further, the color of the light emitted is dependent upon the electroluminescent spectrum of the organic layer in which the recombination takes place. Thus, recombinations in layer 25 near surface 16 results in blue light being emitted. Similarly, recombinations in layer 20 near surface 16 results in green light being emitted and recombinations in layer 15 near surface 16 results in red light being emitted. In this specific embodiment, layer 15 for the red LED is positioned at the bottom with layer 25 for the blue LED deposited last because any effect (absorption, etc.) the extra layers might have on light passing therethrough will be minimized by the longer wavelengths of light passing through the shorter wavelength materials. More specifically, the absorption spectrum of the shorter wavelength emitting materials (i.e. green, blue) is poor in the longer wavelengths which the materials below it are emitting. This is further assisted by the fact that each of these layers (15, 20 and 25) is thin, generally in the range of approximately 200–1000 angstroms.

Thus, by selecting organic materials in which the hole conductivity is sufficiently high (which includes substantially all of the known organic luminescent materials), and by forming layers 15, 20 and 25 relatively thin, the presence of layers 20 and 25 over layer 15 in the formation of red LEDs and layer 25 over layer 20 in the formation of green LEDs has very little effect. This feature allows a substantial simplification of the fabrication of multicolor organic layers for an LED array because it is not necessary to protect the earlier deposited organic layers from subsequently deposited layers.

The presence of additional organic layers in the structure, not near the interface or surface 16, only effects the resulting structure to the extent of any voltage drop across the additional layers. Thus, in the event that it is desired to utilize thicker organic layers or if it is necessary in specific applications to reduce the voltage drop across the additional layers, a partial etch can be utilized to thin the organic layers overlying a previously patterned organic layer. As an example and referring to FIG. 3, the portion of layer 20 overlying layer 15 could be thinned before applying layer 25. Further, the portions of layer 25 overlying layer 20 could be thinned if desired.

It should also be noted that lateral spreading of current in organic layers 15, 20 and 25 is small enough that it is generally unnecessary to etch or separate the organic layers 15, 20 and 25 into individual LEDs. Thus, for example, layer 15 is patterned into columns but there is no necessity to further separate the column into individual LEDs. This feature allows a further and substantial simplification of the fabrication of multicolor organic layers for LED array 10.

Figure 6:
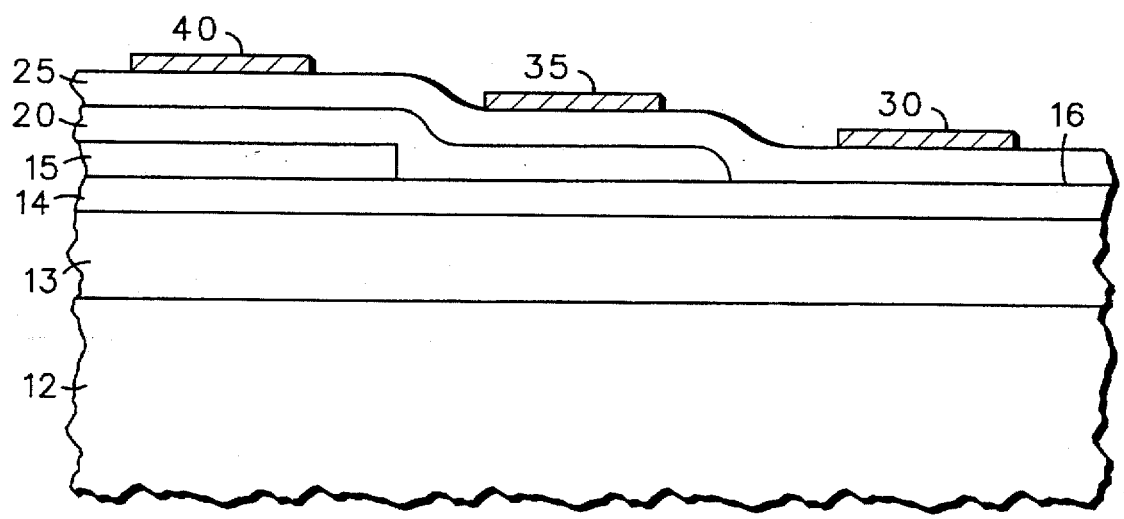
FIG. 6 is an enlarged, simplified sectional view similar to FIG. 5, illustrating a next step in the fabrication process

Referring specifically to FIG. 6, positive terminals for the blue LEDs are formed by depositing columns 30 of conductive material, such as metal, on the surface of organic layer 25 overlying the areas in which organic layer 25 is in contact with surface 16 of electron transport layer 14. Similarly, positive electrical contacts for the green and red LEDs are formed by depositing columns 35 and 40 of conductive material on the surface of organic layer 25 overlying the areas in which organic layers 20 and 15, respectively, are in contact with surface 16 of electron transport layer 14. Thus, because layers 14, 15, 20 and 25 are formed relatively thin and because there is very little lateral current flow in any of these layers, current flows between the rows formed in layer 13 and columns 30, 35 and 40 only at the crossover points. Therefore, a multicolor organic LED array is described wherein three different colored LEDs are addressably formed into pixels in rows and columns.

It should be understood that while three color LEDs are illustrated in a specific embodiment to illustrate full color pixels and, hence, a full color LED array, other LED arrays can be fabricated including simplified versions in which only two colors are utilized. Further, it should also be understood that various individual colored LEDs may be included as pixels in an array for some specific applications.

Generally, either the anode (positive electrical contacts) or the cathode (negative electrical contacts) of an LED must be optically transparent to allow the emission of light therethrough. In this embodiment conductive layers 30, 35 and 40 are formed of indium-tin oxide (ITO) which is optically transparent. In some applications a very thin metal film may be used as a transparent conductor instead of the ITO. Also, to reduce the potential required in embodiments not incorporating electron transport layer 14, the cathode is generally formed of a low work function metal/conductors or combination of metals/conductors, at least one of which has a low work function. In this embodiment the cathode is formed of low work function material, such as heavily doped diamond, or the cathode may be a conductive metal incorporating cesium, calcium or the like.

A list of some possible examples of materials for the organic layer or layers 15, 20 and 25 of the above described organic LEDs follows. As a single layer of organic, some examples are: poly(p-phenylenevinylene) (PPV); poly(p-phenylene) (PPP); and poly[2-methoxy, 5-(2'-ethylhexoxy) 1,4-phenylenevinylene](MEH-PPV). As an electron transporting electroluminescent layer between a hole transporting layer or one of the single layer organics listed above and a low work function metal cathode, an example is: 8-hydroxquinoline aluminum (ALQ). As an electron transporting material, an example is: 2-(4-tert-butylphenyl)-5-(p-biphenylyl)-1,3,4-oxadiazole (butyl-PBD). As a hole transport material, some examples are: 4,4'-bis[N-phenyl-N-(3-methylphenyl)amino]biphenyl (TPD); and 1,1-bis(4-di-p-tolyaminophenyl)cyclohexane. As an example of a fluorescent that may be used as a single layer or as a dopant to an organic charge transporting layer is coumarin 540, and a wide variety of fluorescent dyes. Examples of low work function metals include: Mg:In, Ca, and Mg:Ag.

Figure 7:
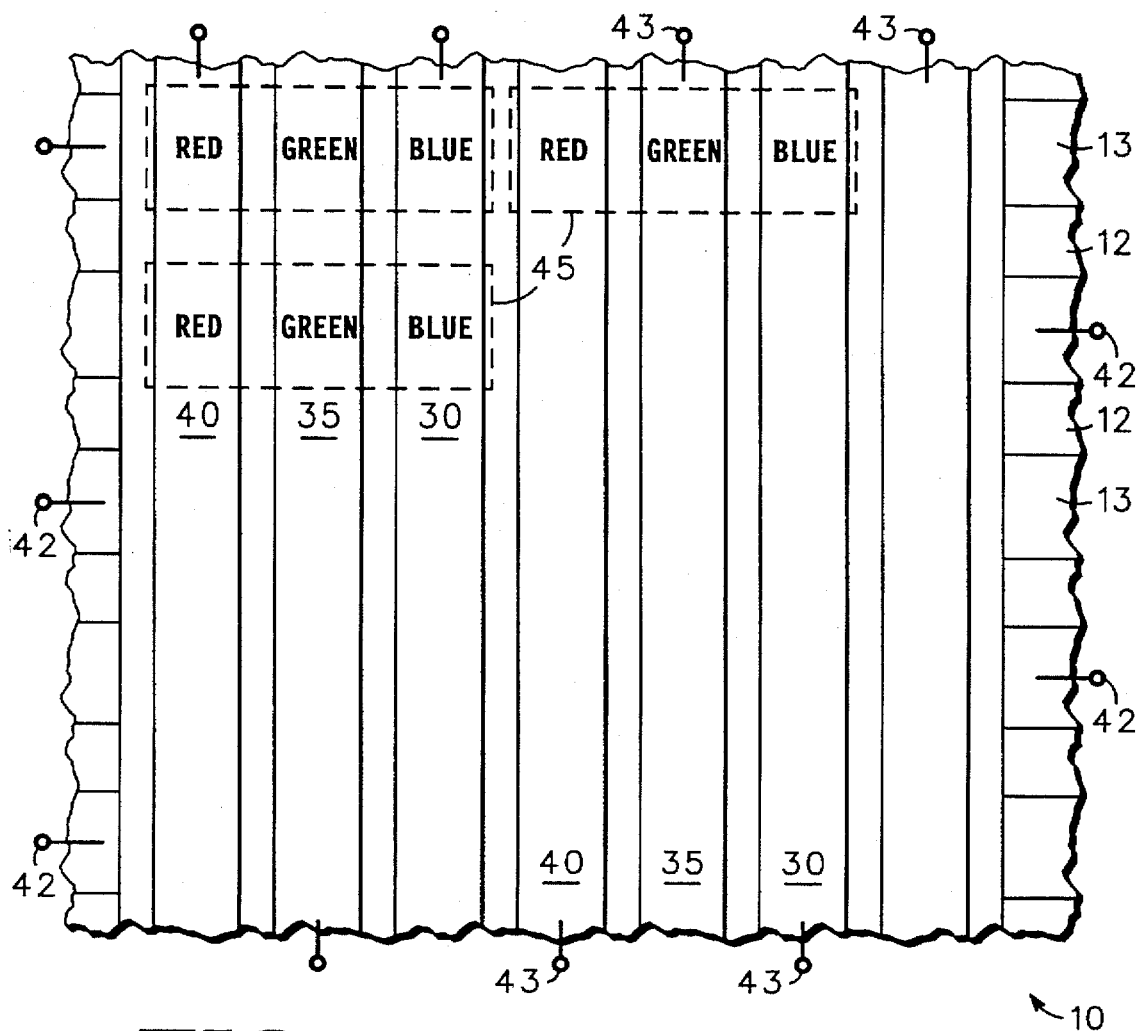
FIG. 7 is a view in top plan of the structure of FIG. 6.

Referring to FIG. 7, a view in top plan of LED array 10 is illustrated. Each row of layer 13 has an external connection, represented herein as a terminal 42, with alternate terminals being accessible at opposite ends to allow the maximum amount of room for connection pads. Also, each column 30, 35 and 40 have an external connection, represented herein as a terminal 43, with alternate terminals being accessible at opposite ends. Array 45 includes a plurality of pixels 45 (outlined in heavy broken lines) each including a red, green and blue LED. Thus, it should be understood that by properly addressing each of the pixels and each of the LEDs in each pixel, a complete color image can be generated by array 10.

Figure 8:
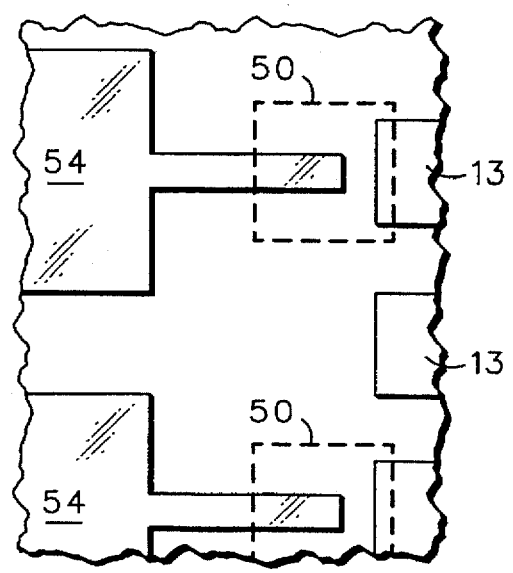
FIGS. 8 and 9 are greatly enlarged top plan and sectional views, respectively, of a portion of an edge of an integrated multicolor organic LED array illustrated similar to that illustrated in FIGS. 6 and 7.
Figure 9:
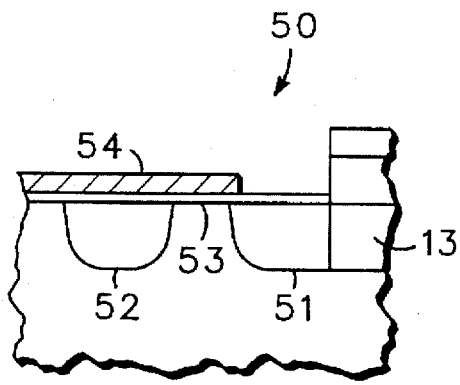

Referring to FIGS. 8 and 9, one example of very simple integrated drive circuitry is disclosed in simplified top plan and sectional views, respectively. In this specific embodiment a single field effect transistor (FET) 50 is integrated onto substrate 12 and utilized to provide drive current to each row of negative contact layer 13. In this simplified example, a source 51 of FET 50 is a doped area in substrate 12 which is formed in contact with a specific row of layer 13. A drain 52 of FET 50 is a doped area which is connected to a relatively negative potential, such as ground. A gate 53 of FET 50 is connected to an external connection pad 54. In operation the rows of layer 13 are sequentially turned on by supplying an appropriate potential to the external pad 54 to turn on FET 50 and connect the selected row of layer 13 to ground potential. It should of course be understood that FET 50 is only for purposes of example to illustrate the ease with which circuitry can be integrated with multicolor organic LED arrays fabricated in accordance with the present invention.

Figure 10:
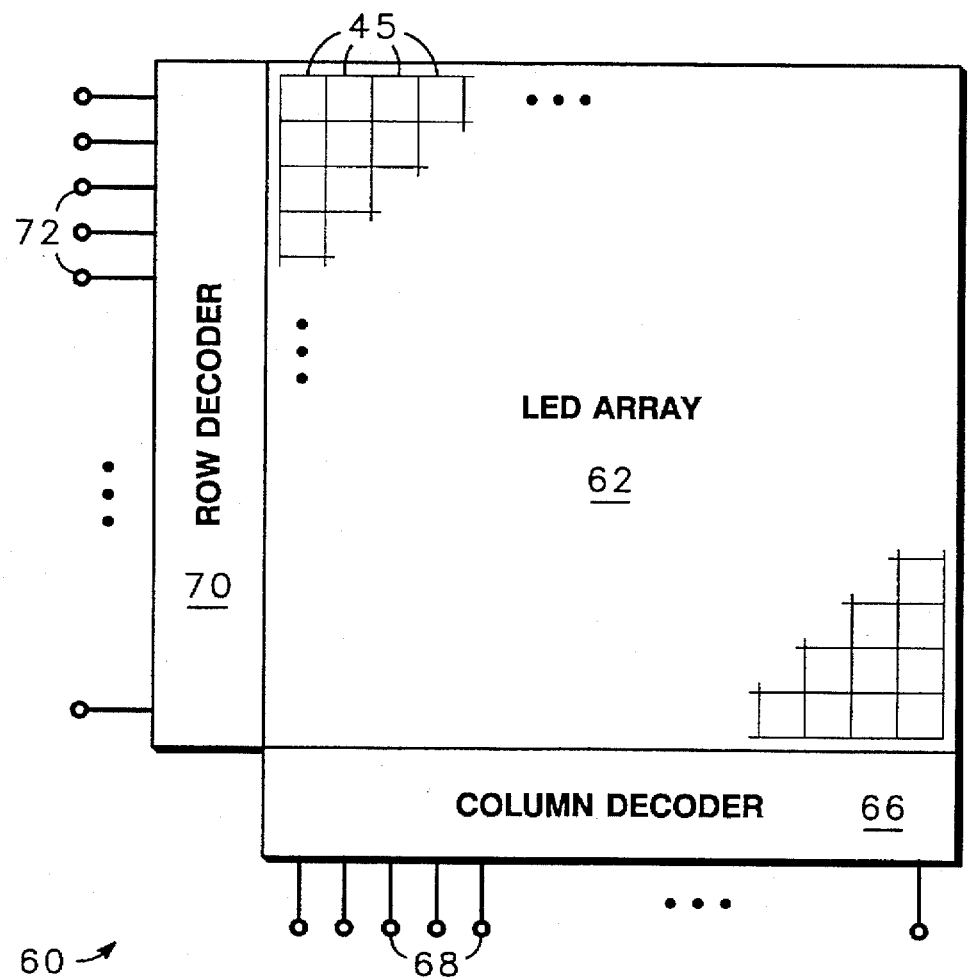
FIG. 10 is a simplified view in top plan of the structure of FIG. 6 integrated into a display.

Referring specifically to FIG. 10, a display source 60 is illustrated in top plan. Display source 60 includes a multicolor organic LED array 62, which is a plurality of pixels 45 arranged in rows and columns. Display source 60 further includes a column decoder 66 electrically connected to pixels 45 and having a plurality of signal input terminals 68 and a row decoder 70 electrically connected to pixels 45 and having a plurality of signal input terminals 72. In this specific embodiment, each pixel 45 includes three light emitting organic elements, or diodes, with driver portions connected to be operated by column and row decoders 68 and 70. By addressing specific pixels 45 by row and column in a well known manner, the specific pixels 45 are energized to produce a real image. Further, by addressing each color LED in each pixel 45, each pixel 45 will produce a different desired color. Digital or analog data is received at an input terminal and converted by data processing circuits, not shown, into signals capable of energizing selected pixels 45 to generate the predetermined real image. Thus, image data is supplied to input terminals 68 and 72 and multicolor organic LED array 62 produces a desired colored image, which image may be continuous or changing in accordance with the image data.

Display source 60 is illustrated simply as a display and decoders but it will be understood that additional image generation apparatus, including data processing circuits may be included on the same or additional chips. Data processing circuits generally include logic and switching circuit arrays, some of which are incorporated into decoders 66 and 70, for controlling each pixel 45. Data processing circuits include, in addition to or instead of the logic and switching arrays, a microprocessor or similar circuitry for processing input signals to produce a desired real colored image on multicolor organic LED array 62. It will be understood by those skilled in the art that multicolor organic LED array 62 and decoders 66 and 70 are greatly enlarged in FIG. 10. The actual size of a semiconductor chip containing the entire image generation apparatus is on the order of a few millimeters along each side with each LED in each pixel 45 being on the order of as little as ten microns or less on a side.

Thus, a new and improved multicolor organic LED array is disclosed which is relatively simple to fabricate, because many steps required in the fabrication of prior art LEDs are eliminated. These advantages are realized generally because of the low electron transport and high hole transport of the organic materials, the hole blocking effect of the electron transport material and the low lateral current conduction of the organic materials. The lateral current conduction is further reduced by the small thickness of the active layers. Generally, because of these features the various organic layers can be deposited in overlying relationship and there is no necessity to isolate individual LEDs. However, in some specific examples, it may be desirable to isolate individual LEDs and this can be accomplished with an oxygen etch. The effects of depositing organic layers in overlying relationship are further reduced by organizing the various colored LEDs in order of color or wavelength, e.g. red at the bottom with blue on top, so that minimal absorption of the colors occurs in the overlying layers.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A method of fabricating integrated multicolor organic layers for an LED array comprising the steps of:

providing an electrical contact layer having a planar surface; and depositing a plurality of the different color LED organic semiconductor layers, one at a time, on the planar surface of the electrical contact layer to form a plurality of different color LEDs in a plurality of areas of a selected array including patterning a first color LED organic layer of the plurality of organic layers to remain on the planar surface of the electrical contact layer in first areas and to define and expose additional areas in the selected array for additional LEDs laterally separated from the first color LEDs in the first areas, and depositing a final color LED organic layer of the plurality of organic layers on the planar surface in defined and exposed final areas of the additional areas and on previously patterned color organic layers to form a plurality of final color LEDs in the defined and exposed final areas of the selected array.

2. A method of fabricating integrated multicolor organic layers for an LED array as claimed in claim 1 wherein the step of depositing a plurality of different color LED organic layers includes depositing the different color organic layers in order of wavelength of the color of the layer, with the longest wavelength being deposited first.

* * * * *